(12) United States Patent
Giacoma et al.

(10) Patent No.: US 7,108,052 B2
(45) Date of Patent: Sep. 19, 2006

(54) LOW-COST METHOD OF FORMING A HEAT EXCHANGER WITH AN INCREASED HEAT TRANSFER EFFICIENCY

(75) Inventors: Lawrence M. Giacoma, Plano, TX (US); Jimmy D. Cummings, Wylie, TX (US)

(73) Assignee: Tellabs Petaluma, Inc., Petaluma, CA (US)

( * ) Notice: Subject to any disclaimer, the term of this patent is extended or adjusted under 35 U.S.C. 154(b) by 288 days.

(21) Appl. No.: 10/606,452

(22) Filed: Jun. 26, 2003

(65) Prior Publication Data

US 2004/0261985 A1  Dec. 30, 2004

(51) Int. Cl.
*F28D 9/00*  (2006.01)

(52) U.S. Cl. .............. 165/165; 165/DIG. 399; 165/104.34; 361/697

(58) Field of Classification Search ............ 29/890.03; 165/104.34, 165; 361/697
See application file for complete search history.

(56) References Cited

U.S. PATENT DOCUMENTS

| | | | | |
|---|---|---|---|---|
| 2,019,351 A | * | 10/1935 | Lathrop | 165/165 |
| 3,559,728 A | * | 2/1971 | Lyman et al. | 165/55 |
| 3,829,945 A | * | 8/1974 | Kanzler et al. | 29/890.03 |
| 4,040,804 A | * | 8/1977 | Harrison | 96/118 |
| 4,254,827 A | * | 3/1981 | Forster et al. | 165/166 |
| 4,384,611 A | | 5/1983 | Fung | 165/166 |
| 4,386,651 A | * | 6/1983 | Reinhard | 165/104.33 |
| 4,739,827 A | * | 4/1988 | Onuki | 165/165 |
| 4,860,824 A | * | 8/1989 | Foley et al. | 165/165 |
| 6,059,023 A | * | 5/2000 | Kurematsu | 165/165 |
| 6,247,526 B1 | * | 6/2001 | Okamoto et al. | 165/122 |
| 6,408,941 B1 | * | 6/2002 | Zuo | 165/165 |
| 6,789,612 B1 | * | 9/2004 | Okamoto et al. | 165/104.34 |
| 2002/0170706 A1 | * | 11/2002 | Hosokawa et al. | 165/164 |

FOREIGN PATENT DOCUMENTS

| | | | |
|---|---|---|---|
| DE | 2231469 | * | 3/1974 |
| DE | 25 46 450 A1 | | 4/1976 |
| EP | 1 134 536 A2 | | 9/2001 |
| EP | 1 251 325 A2 | | 10/2002 |
| FR | 2 078 558 A | | 11/1971 |
| GB | 1 498 621 A | | 1/1978 |
| JP | 55118598 A | * | 9/1980 |
| JP | 58145891 A | * | 8/1983 |

* cited by examiner

*Primary Examiner*—Allen J. Flanigan
(74) *Attorney, Agent, or Firm*—Mark C. Pickering

(57) ABSTRACT

The efficiency of a heat exchanger is significantly improved by forming walls in an air flow structure, which has first grooves formed in the top surface of the structure and second grooves formed in the bottom surface of the structure, that block off alternating ends of the first and second grooves such that a first air source can only flow through the first grooves and a second air source can only flow through the second grooves.

14 Claims, 10 Drawing Sheets

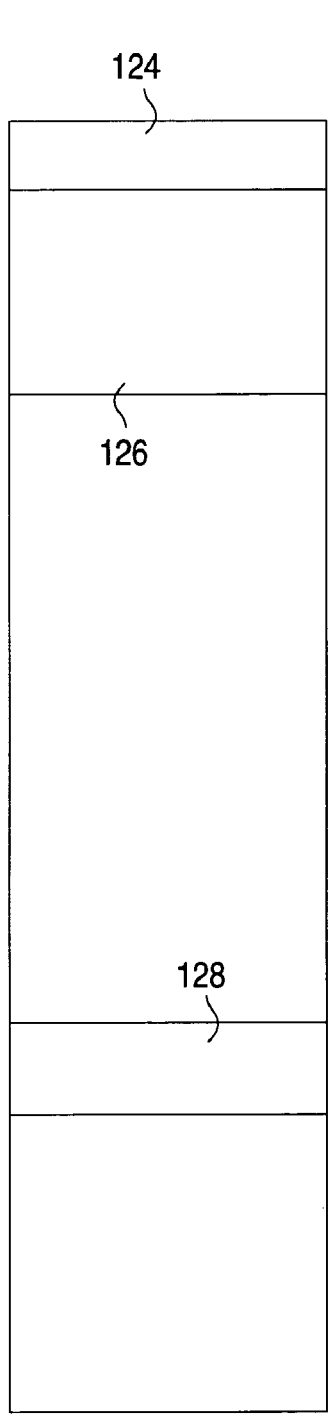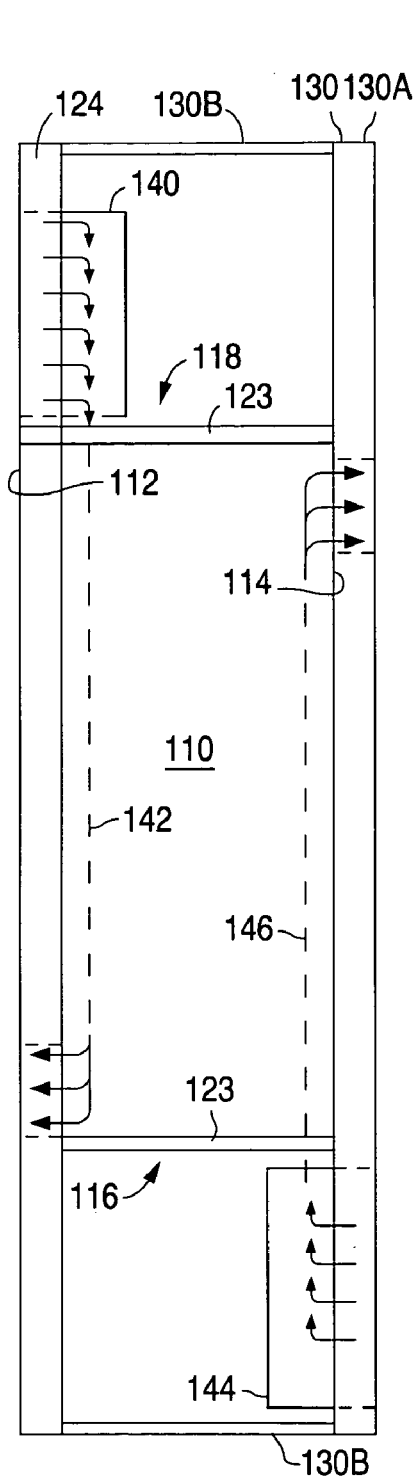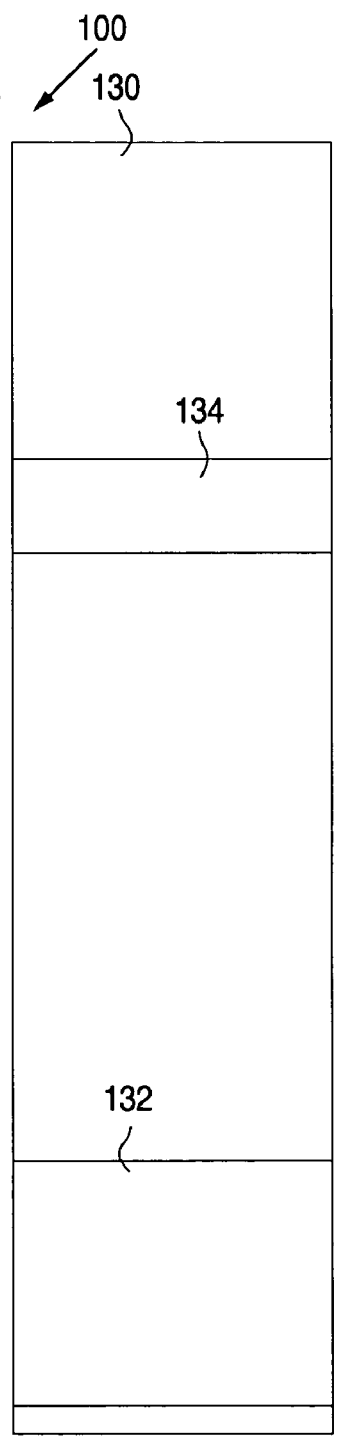
FIG. 1A
(PRIOR ART)
FIG. 1B
(PRIOR ART)
FIG. 1C
(PRIOR ART)

LOW-COST METHOD OF FORMING A HEAT EXCHANGER WITH AN INCREASED HEAT TRANSFER EFFICIENCY

BACKGROUND OF THE INVENTION

1. Field of the Invention

The present invention relates to heat exchangers and, more particularly, to a heat exchanger with an increased heat transfer efficiency and a low-cost method of forming the heat exchanger.

2. Description of the Related Art

Telecommunications equipment is commonly housed in electronics cabinets that sit outside in residential and commercial neighborhoods. The cabinets are water tight and air tight to prevent water and dust from entering the cabinets and reducing the useful life of the equipment inside the cabinets.

When operating as intended, the telecommunications equipment produces heat which can damage the equipment when the heat inside the cabinet exceeds a predetermined temperature. To maintain an air tight enclosure and prevent the temperature from exceeding the predetermined temperature, electronics cabinets often use air-to-air heat exchangers.

FIGS. 1A–1C show views that illustrate a prior art air-to-air heat exchanger 100. FIG. 1A is a top plan view, FIG. 1B is a right side view, and FIG. 1C is a bottom plan view. As shown in FIGS. 1A–1C, heat exchanger 100 includes an air flow structure 110 that directs the flow of external and internal air through heat exchanger 100.

FIGS. 1D–1E show views that further illustrate air flow structure 110. FIG. 1D is a partial perspective view, and FIG. 1E is a partial plan view. As shown in FIGS. 1A–1E, air flow structure 110 has a top surface 112 and a bottom surface 114. In addition, structure 110 has a width W, a length L, a first end 116 that runs along the width W, and a second end 118 that runs along the width W.

In addition, air flow structure 110 includes a number of first grooves G1 that are formed in the top surface 112, and a number of second grooves G2 that are formed in the bottom surface 114. As shown, the first and second grooves G1 and G2 extend along the length L between the first and second ends 116 and 118.

Heat exchanger 100 also includes a number of first crimped ends 120 that close alternate ends of the second grooves G2 along the first end 116, and a number of second crimped ends 122 that close alternate ends of the first grooves G1 along the second end 118. In addition, a caulked region 123 is formed around each of the first and second crimped ends 120 and 122 to form an air tight seal.

As further shown in FIGS. 1A–1C, heat exchanger 100 also includes a first plate 124 that is formed adjacent to the top surface 112 of air flow structure 110. In the example, first plate 124 contacts the top surface 112, the first crimped ends 120, the second crimped ends 122, and the caulked regions 123 to form an air tight connection. In addition, first plate 124 has an external air inlet opening 126, and an external air exit opening 128. Opening 126 exposes a region adjacent to air flow structure 110, while opening 128 exposes the second grooves G2 of air flow structure 110.

Heat exchanger 100 further includes a second plate 130 that is formed adjacent to the bottom surface of 114 air flow structure 110. In the example, second plate 130 contacts the bottom surface 114, the first crimped ends 120, the second crimped ends 122, and the caulked regions 123 to form an air tight connection. Further, second plate 130 includes a base section 130A and sidewalls 130B that extend perpendicularly away from base section 130A to form an enclosure. The enclosure formed by base section 130A and sidewalls 130B is connected to first plate 124 to form an air tight connection.

Second plate 130 also has an internal air inlet opening 132, and an internal air exit opening 134. Opening 132 exposes a region adjacent to air flow structure 110, while opening 134 exposes the first grooves G1 of air flow structure 110.

As further shown in FIGS. 1A–1C, heat exchanger 100 includes an air flow generator 140, such as an axial fan, that is connected to first plate 124 adjacent to opening 126. Air flow generator 140 causes external air to follow a path 142 in through opening 126, along the second grooves G2, and out through opening 128.

Heat exchanger 100 additionally includes an air flow generator 144, such as an axial fan, that is connected to second plate 130 adjacent to opening 132. Air flow generator 144 causes internal air to follow a path 146 in through opening 132, along the first grooves G1, and out through opening 134.

In operation, a stream of internal cabinet air circulates through the telecommunications equipment, through opening 132 in second plate 130, and through the grooves G1. The stream of internal cabinet air continues through openings 134 in second plate 130 and back through the telecommunications equipment. As the internal cabinet air circulates, the internal cabinet air transfers heat to the skin of air flow structure 110.

At the same time, a stream of external air is pulled in from the outside through opening 126, and through grooves G2. The stream of external air continues through opening 128 and is exhausted without mixing with the internal cabinet air. The external air, which is cooler than the internal cabinet air, absorbs heat from the skin of air flow structure 110, thereby effecting a transfer of heat from the internal cabinet air to the external air.

One trend in the telecommunications industry is to make line replaceable cards such that, for example, a card that supports plain old telephone service (POTS) can be replaced with a card that supports both POTS and xDSL broadband data service. Replacement cards which provide more than basic POTS service, however, tend to generate more heat than basic POTS cards.

One problem with heat exchanger 100 is that it is difficult to increase the efficiency by which heat is transferred out of the cabinet. Thus, when a telecommunications cabinet is at or near its maximum heat capacity, it is difficult to replace basic POTS cards with cards that provide a wider variety of services without exceeding the maximum heat capacity of the cabinet.

One reason that it is difficult to increase the efficiency of heat exchanger 100 is that it is difficult to increase the number of grooves G1 and G2 per 2.54 centimeters (inch) beyond about two grooves per 2.54 centimeters (inch). FIGS. 1F–1H show perspective drawings that illustrate the fabrication of air flow structure 110.

As shown in FIG. 1F, to fabricate air flow structure 110, a corrugated air flow structure 150 is formed using conventional techniques. Next, as shown in FIG. 1G, alternate ends of air flow structure 150 are crimped to form crimped ends 120 and 122. The first and second plates 124 and 130 are attached to air flow structure 150. To prevent the internal cabinet air from mixing with the external air, the crimped ends 120 and 122 between the first and second plates 124 and 130 must be sealed. As shown in FIG. 1H, this is typically accomplished by hand applying a caulking material to the crimped ends 120 and 122 to form caulked regions 123.

However, to apply the caulking material, a significant amount of space is required to provide the access needed by the caulking gun. In addition, once the caulked regions 123 have been formed, the lateral spacing X between adjacent caulked regions 123 is relatively small. Thus, the small lateral space X between adjacent caulked regions 123 limits the number of grooves G1 and G2 that are available to approximately two per 2.54 centimeters (inch).

Heat exchanger 100 is also relatively expensive to fabricate. One reason for this is that the caulking material that is applied to the crimped ends 120 and 122 and the first and second plates 124 and 130 to formed caulked regions 123 is typically applied by hand. This, in turn, is a time consuming and expensive process. Thus, there is a need for a more efficient and less costly heat exchanger.

SUMMARY OF THE INVENTION

A method of forming a heat exchanger in accordance with a first embodiment is disclosed. The method includes forming an air flow structure that has a top surface, a bottom surface, a width, a length, a first edge that runs along the width, and a second edge that runs along the width. In addition, the air flow structure includes a plurality of first grooves in the top surface, and a plurality of second grooves in the bottom surface. The first and second grooves extend along the length between the first and second edges. Each groove has a substantially uniform width from the first edge to the second edge.

The method also includes forming a plurality of first walls connected to the air flow structure by placing the first edge in a mold, and introducing an elastomer into the mold.

A method of forming an air flow structure in accordance with a second embodiment is disclosed. The air flow structure has a plurality of alternating ridges and grooves. Each ridge and groove has sidewalls that extend from a first end to a second end, a first opening at the first end, a second opening at the second end, and an elongated opening that extends from the first opening to the second opening.

The method comprises forming a first wall that is connected to the first end of the air flow structure to completely close each first opening of a plurality of ridges and grooves. The method also comprises forming a second wall that is connected to the second end of the air flow structure to completely close each second opening of a plurality of ridges and grooves.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIGS. 1A–1C are views illustrating a prior art air-to-air heat exchanger 100. FIG. 1A is a top plan view, FIG. 1B is a right side view, and FIG. 1C is a bottom plan view.

FIG. 1D is a partial perspective view, and FIG. 1E is a partial plan view.

FIG. 2A is a front side perspective view, while FIG. 2B is a back side perspective view. FIG. 2C is a top plan view taken between lines 2C1—2C1 and 2C2—2C2 of FIG. 2A, FIG. 2D is a right side view taken along lines 2D—2D of FIG. 2C, and FIG. 2E is a bottom plan view taken between lines 2E1—2E1 and 2E2—2E2 of FIG. 2B. FIG. 2F is a perspective view of FIG. 2C taken along lines 2F—2F of FIG. 2C, and FIG. 2G is an end view taken along lines 2F—2F of FIG. 2C.

FIG. 3A is a perspective view, while FIG. 3B is an end view.

FIG. 4A is a perspective view, while FIG. 4B is an end view.

DETAILED DESCRIPTION OF THE INVENTION

Figures 1D, 1E:
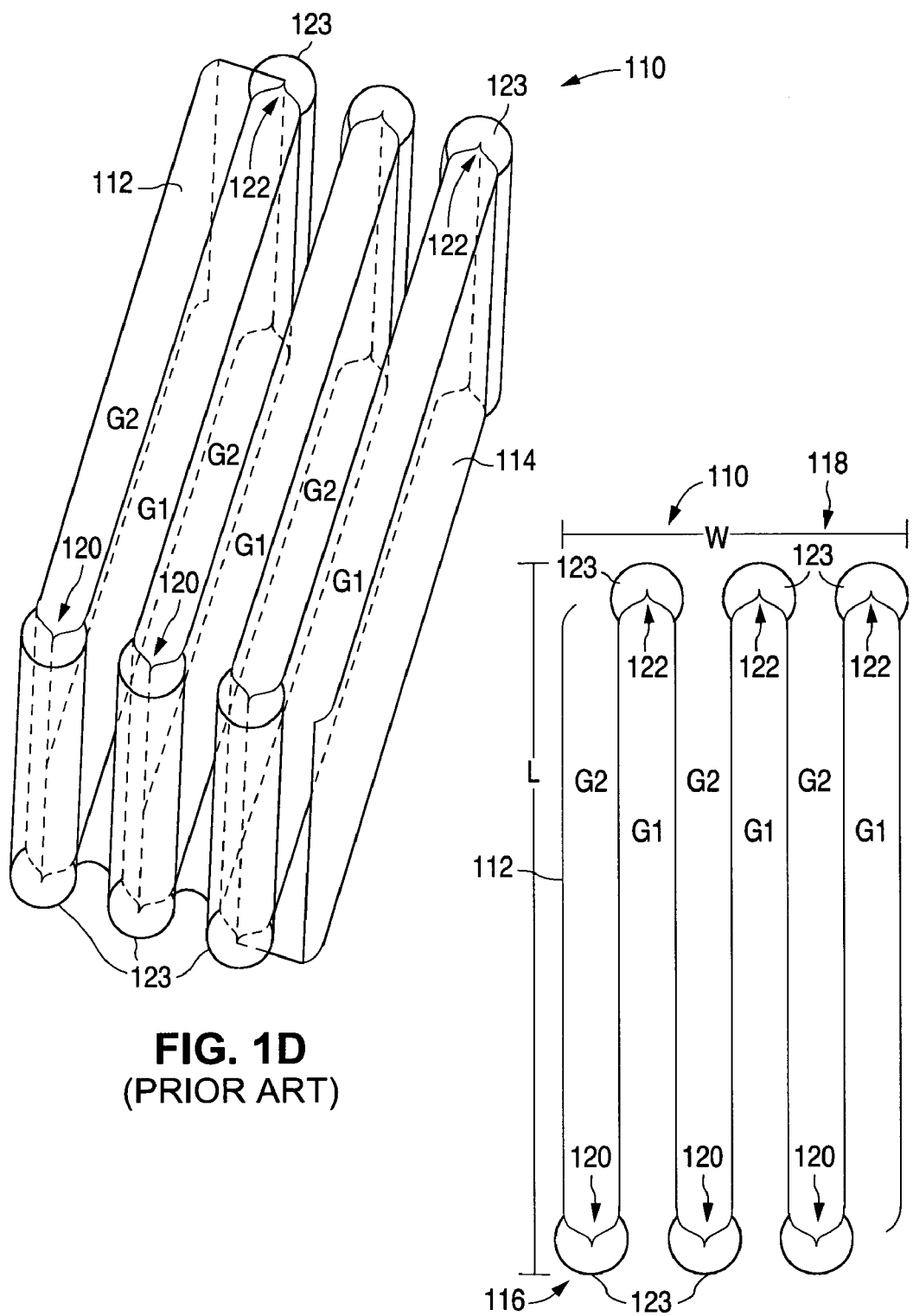
FIGS. 1D–1E are views further illustrating air flow structure 110.
Figures 1F, 1G:
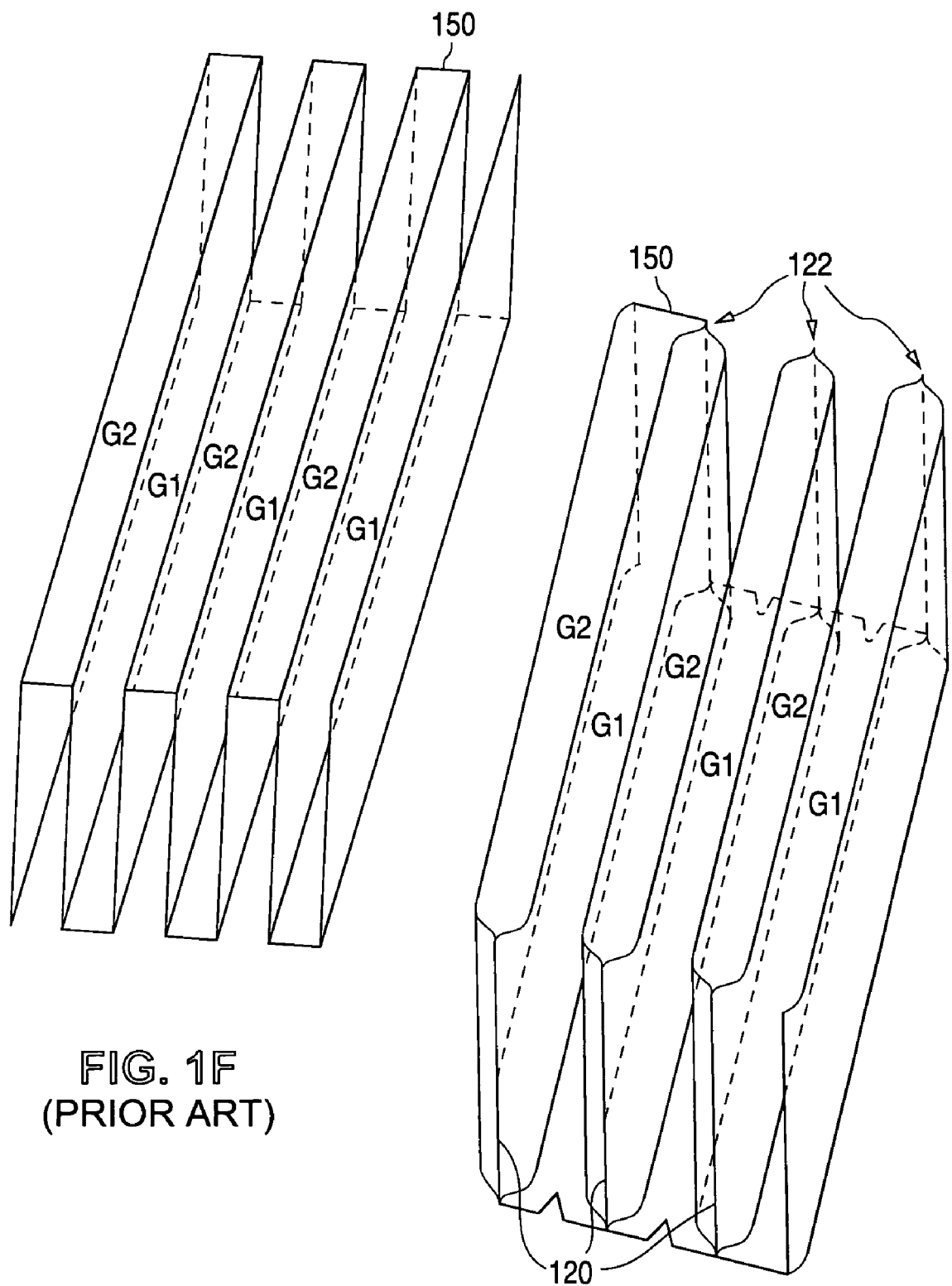
FIGS. 1F–1H are perspective drawings illustrating the fabrication of air flow structure 110.
Figure 1H:
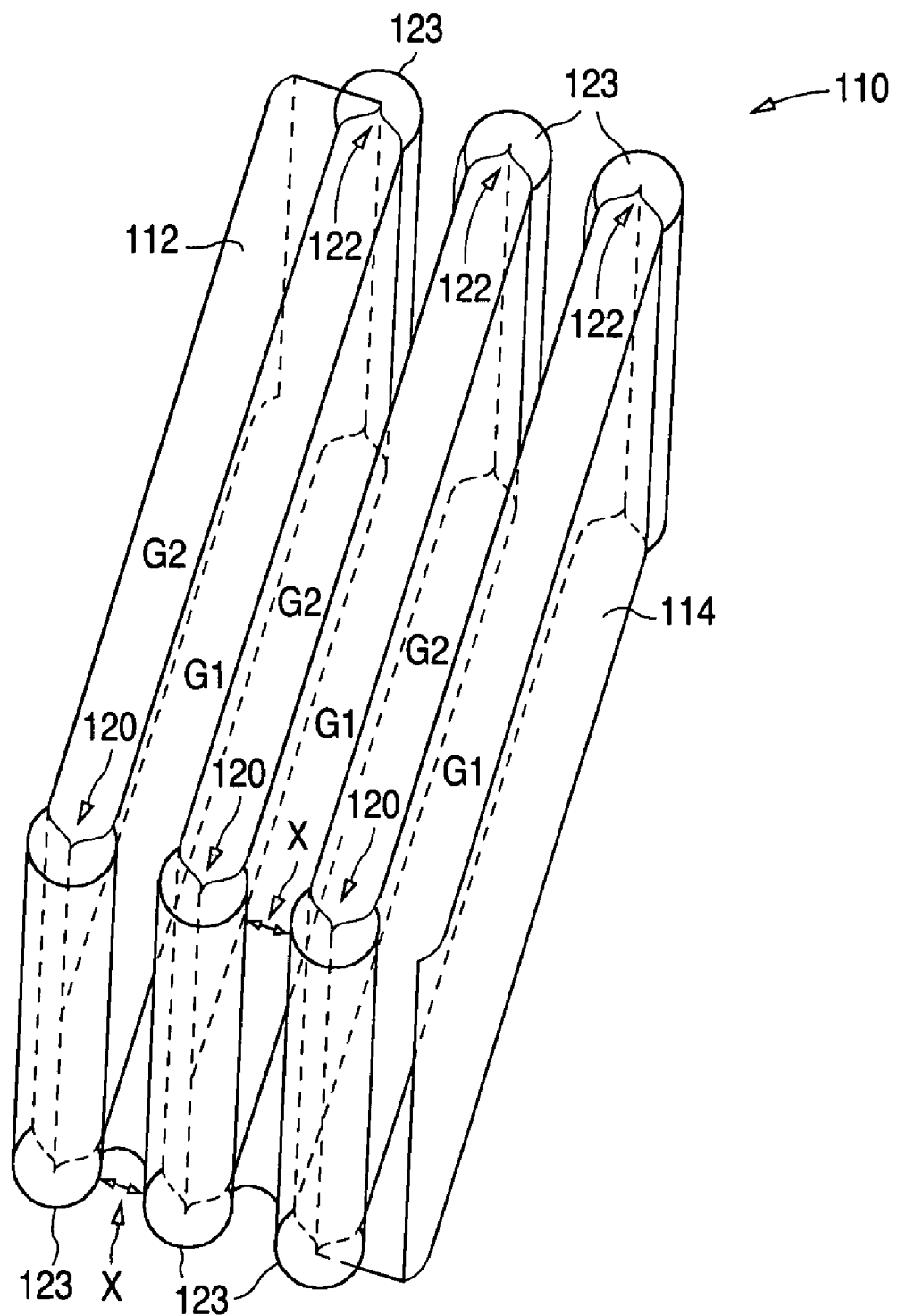
Figure 2A:
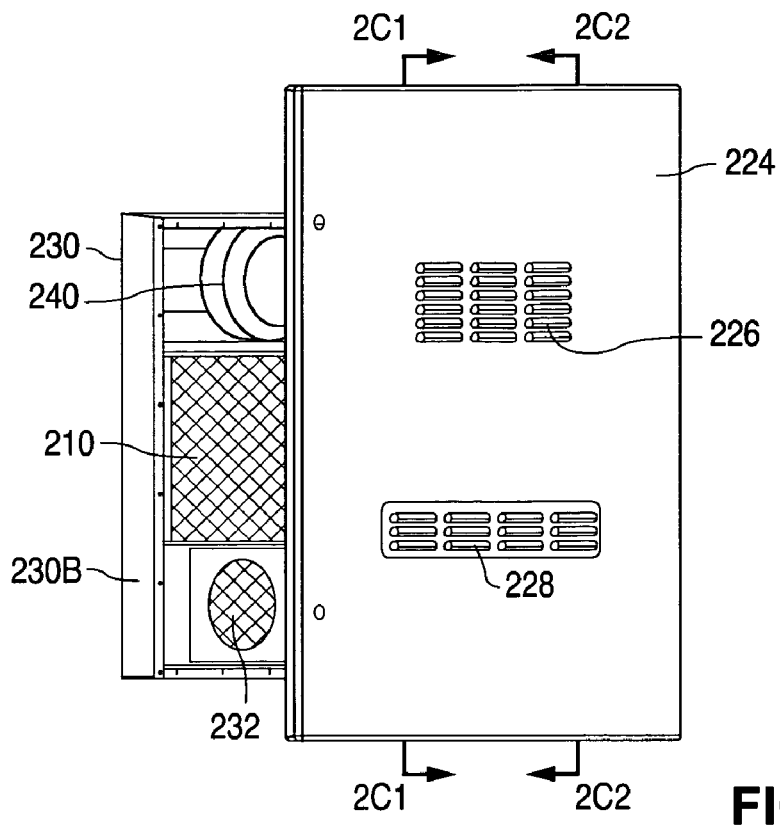
FIGS. 2A–2G are a series of views illustrating an example of a heat exchanger 200 in accordance with the present invention.
Figure 2B:
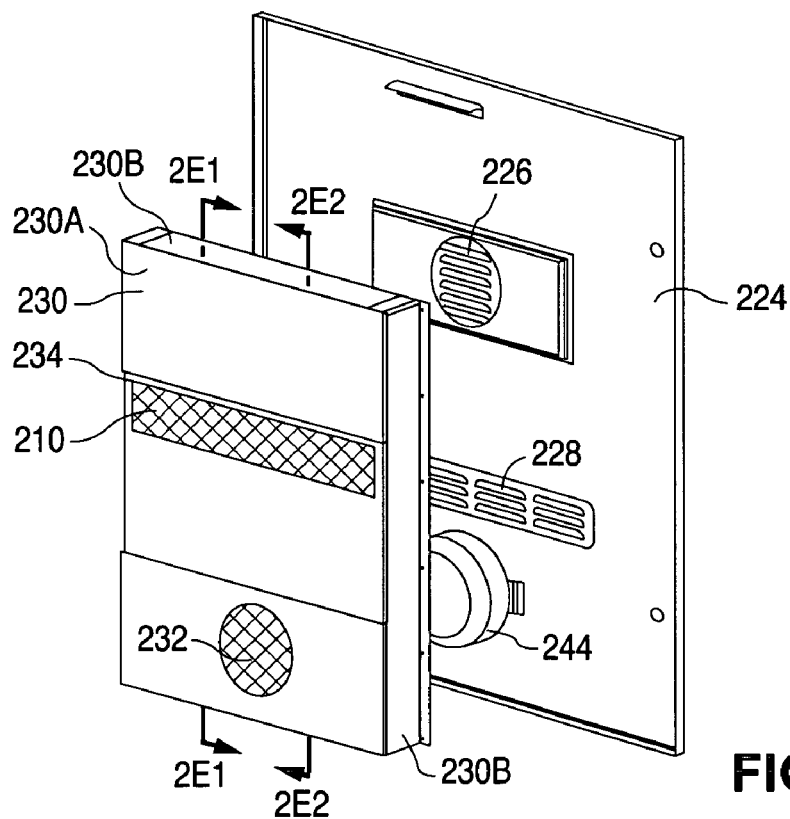
Figure 2C:
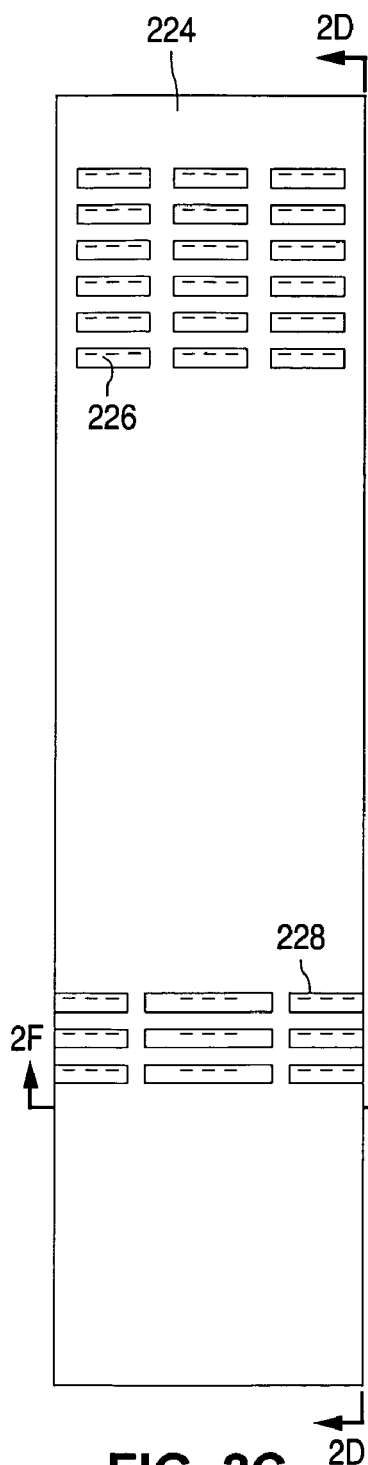
Figure 2D:
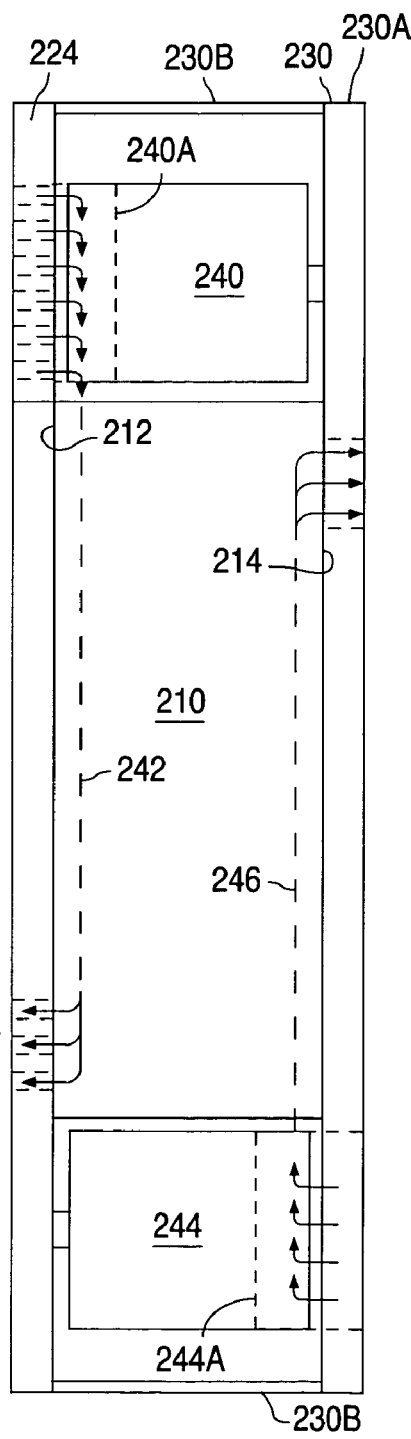
Figure 2E:
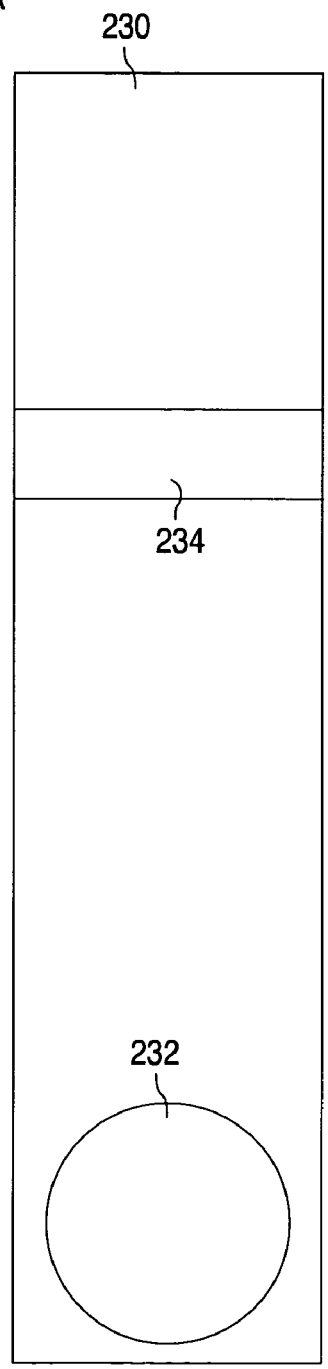
Figure 2F:
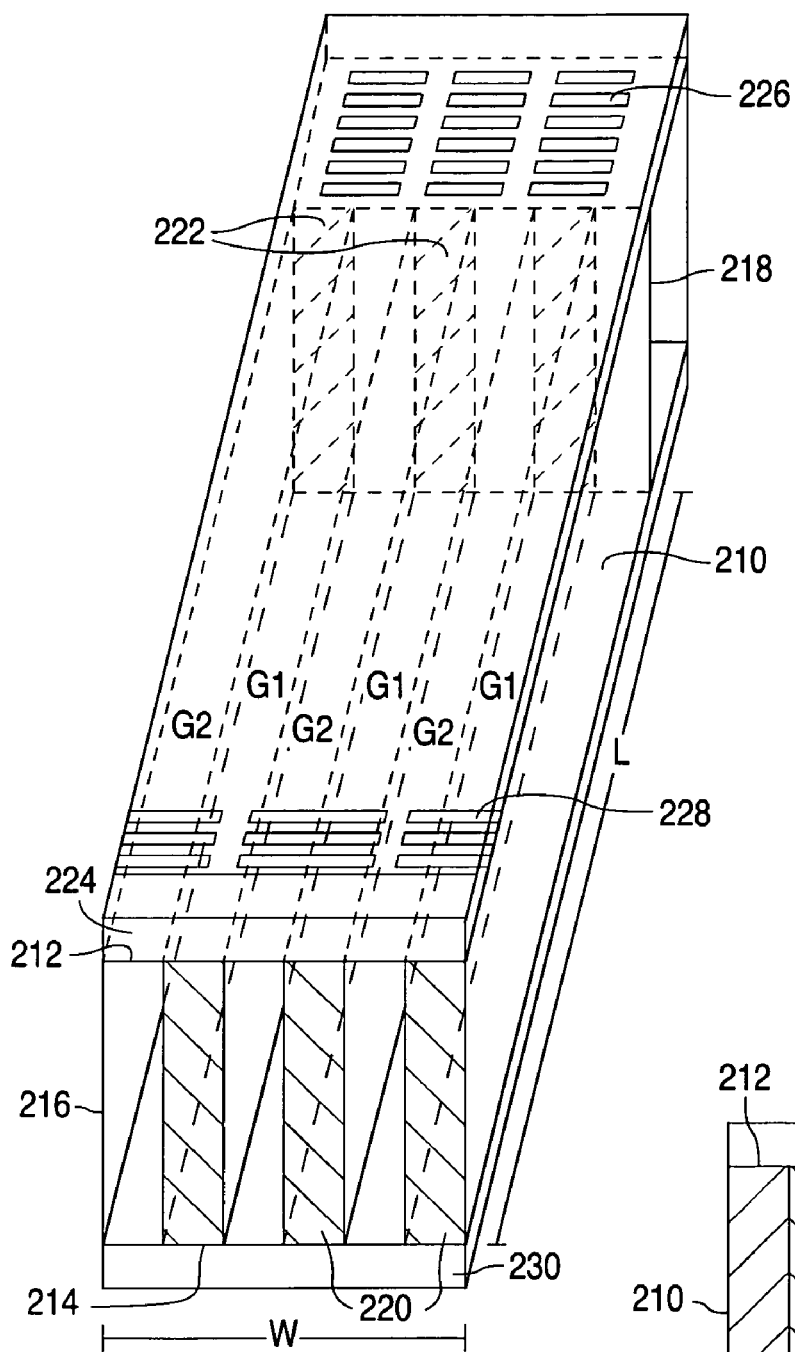
Figure 2G:
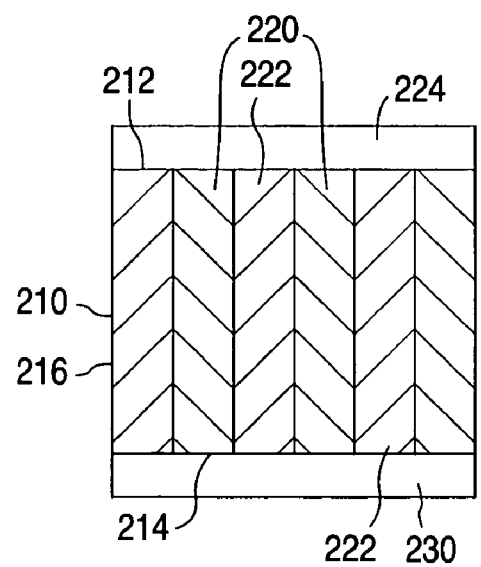

FIGS. 2A–2G show a series of views that illustrate an example of a heat exchanger 200 in accordance with the present invention. FIG. 2A shows a front side perspective view, while FIG. 2B shows a back side perspective view. FIG. 2C shows a top plan view taken between lines 2C1—2C1 and 2C2—2C2 of FIG. 2A, FIG. 2D shows a right side view taken along lines 2D—2D of FIG. 2C, and FIG. 2E shows a bottom plan view taken between lines 2E1—2E1 and 2E2—2E2 of FIG. 2B. FIG. 2F shows a perspective view of FIG. 2C taken along lines 2F—2F of FIG. 2C, and FIG. 2G shows an end view taken along lines 2F—2F of FIG. 2C.

As shown in FIGS. 2A–2G, heat exchanger 200 includes an air flow structure 210 that directs the flow of external and internal air through heat exchanger 200. Air flow structure 200, in turn, has a top surface 212 and a bottom surface 214. In addition, structure 200 has a width W, a length L, a first edge 216 that runs along the width W, and a second edge 218 that runs along the width W.

Further, air flow structure 210 includes a number of first grooves G1 that are formed in the top surface 212, and a number of second grooves G2 that are formed in the bottom surface 214. As shown, the first and second grooves G1 and G2 extend along the length L between the first and second edges 216 and 218.

Figures 3A, 3B:
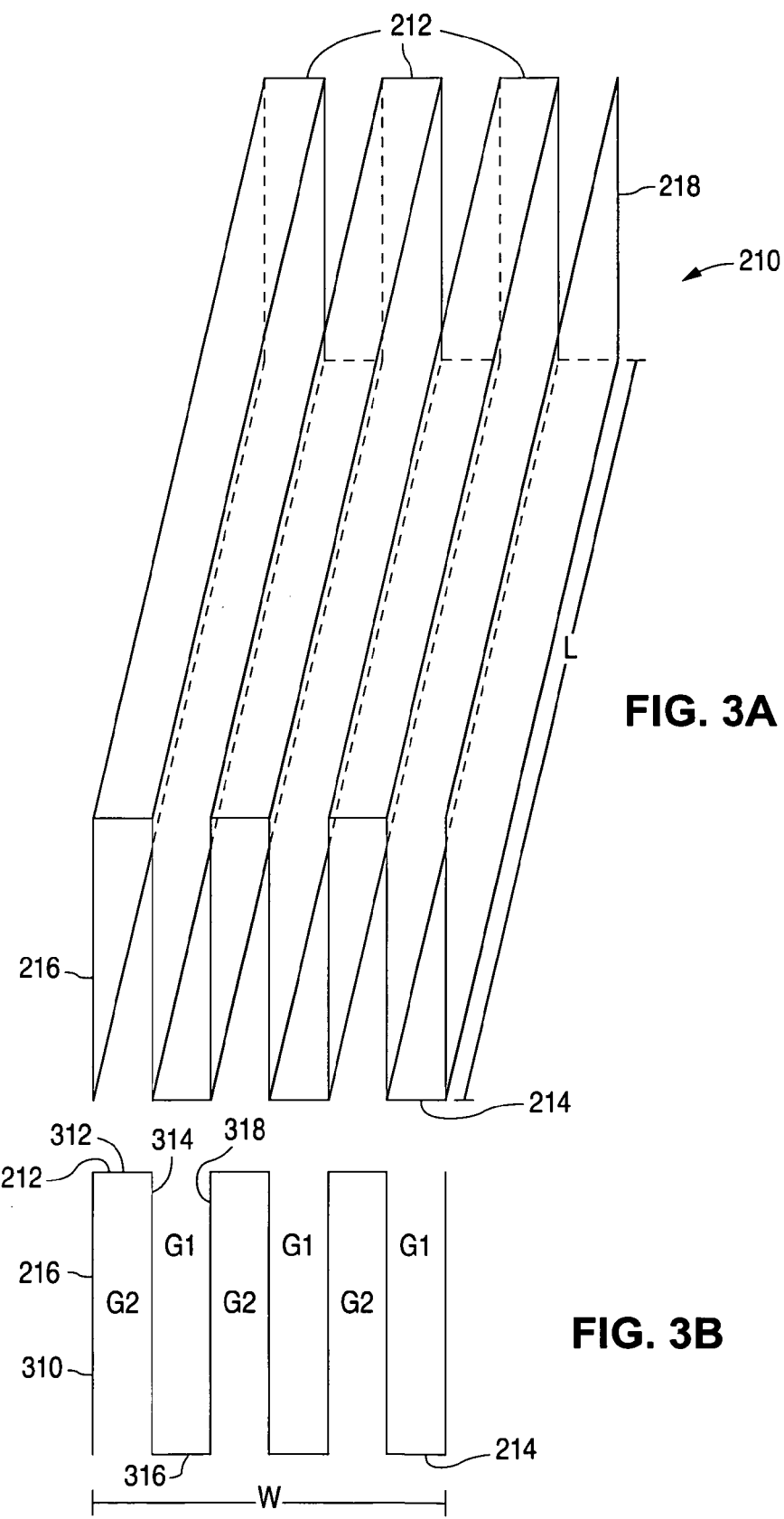
FIGS. 3A–3B are views more clearly illustrating air flow structure 210 in accordance with the present invention.

FIGS. 3A–3B show views that more clearly illustrate air flow structure 210 in accordance with the present invention. FIG. 3A shows a perspective view, while FIG. 3B shows an end view. As noted above, air flow structure 210 has a top surface 212, a bottom surface 214, a width W, a length L, a first edge 216, and a second edge 218.

As further noted above, structure 210 also has a number of first grooves G1 that are formed in the top surface 212, and a number of second grooves G2 that are formed in the bottom surface 214. The first and second grooves G1 and G2 extend along the length L between the first and second edges 216 and 218. In accordance with the present invention, each groove G1 and G2 has a substantially uniform width from the first edge 216 to the second edge 218.

As shown in FIGS. 3A–3B, air flow structure 210 forms the first and second grooves G1 and G2 by running vertically to form a vertical side 310, turning and running horizontally away from side 310 to form a top side 312, and turning and running vertically away from side 312 to form a vertical side 314 that is substantially parallel with vertical side 310.

As further shown in FIGS. 3A–3B, structure 210 continues by running horizontally away from sides 310 and 314 to form a bottom side 316, and turning and running vertically away from side 316 to form a vertical side 318 that is substantially parallel with vertical sides 310 and 314. The remainder of structure 210 is formed by continuing this same pattern. Thus, in the example shown in FIGS. 3A–3B, each adjacent first and second groove G1 and G2 share a section of the air flow structure.

Although air flow structure 210 forms the first and second grooves G1 and G2 with a corrugated shape, other shapes can alternately be used. For example, from an end view, air flow structure 210 can have a saw-tooth shape, a saw-tooth shape with flattened peaks and valleys, or a sinusoidal shape. In addition, air flow structure 210 can be formed from metal, such as aluminum, or other heat conducting materials.

Referring again to FIGS. 2A–2G, heat exchanger 200 also includes a number of first walls 220 that are connected to air flow structure 210 such that each first wall 220 extends from a section on a first side of a first groove G1 to a section on a second opposing side of the first groove G1 to form a closed end. The first walls 220 and first grooves G1 have substantially equal widths.

Similarly, air flow structure 210 also includes a number of second walls 222 that are connected to air flow structure 210 such that each second wall 222 extends from a section on a first side of a second groove G2 to a section on a second opposing side of the second groove G2 to form a closed end. The second walls 222 and second grooves G2 have substantially equal widths.

Figures 4A, 4B:
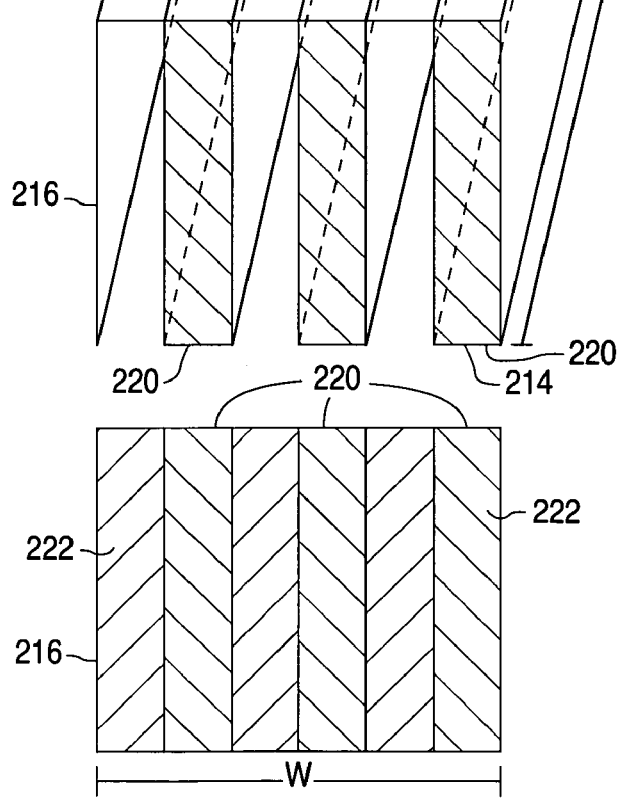
FIGS. 4A–4B are views more clearly illustrating first and second walls 220 and 222 with air flow structure 210 with in accordance with the present invention.

FIGS. 4A–4B show views that more clearly illustrate first and second walls 220 and 222 with air flow structure 210 in accordance with the present invention. FIG. 4A shows a perspective view, while FIG. 4B shows an end view. As previously discussed above, the first walls 220 are connected to air flow structure 210 such that each first wall 220 extends from a section on a first side of a first groove G1 across to a section on a second opposing side of the first groove G1 to close the end of the first groove G1.

As further discussed above, the second walls 222 are connected to air flow structure 210 such that each second wall 222 extends from a section on a first side of a second groove G2 across to a section on a second opposing side of the second groove G2 to close the end of the second groove G2. In addition, the first and second walls 220 and 222 and the first and second grooves G1 and G2 have substantially equal widths.

Referring again to FIGS. 2A–2G, heat exchanger 200 also includes a first plate 224 that is formed adjacent to the top surface 212 of air flow structure 210. In the example shown in FIGS. 2A–2G, first plate 224 contacts the top surface 212, the first walls 220, and the second walls 222 to form an air tight connection.

In addition, first plate 224 has a plurality of openings 226 that form an external air inlet, and a plurality of openings 228 that form an external air exit. Openings 226 expose a region adjacent to air flow structure 210, while openings 228 expose the first grooves G1 of air flow structure 210. (A single opening can alternately be used in lieu of openings 226, and a single opening can alternately be used in lieu of openings 228.)

Heat exchanger 200 further includes a second plate 230 that is formed adjacent to the bottom surface of 214 air flow structure 210. In the example shown in FIGS. 2A–2G, second plate 230 contacts the bottom surface 214, the first walls 220, and the second walls 222 to form an air tight connection. Further, second plate 230 includes a base section 230A and sidewalls 230B that extend perpendicularly away from base section 230A to form an enclosure. The enclosure formed by base section 230A and sidewalls 230B is connected to first plate 224 to form an air tight connection.

Second plate 230 also has an opening 232 that forms an internal air inlet, and an opening 234 that forms an internal air exit. Opening 232 exposes a region adjacent to air flow structure 210, while opening 234 exposes the second grooves G2 of air flow structure 210. (A plurality of openings can alternately be used instead of opening 232, and a plurality of openings can alternately be used instead of opening 234.)

As further shown in FIGS. 2A–2G, heat exchanger 200 includes an air flow generator 240, such as a radial fan, that is connected to second plate 230 adjacent to openings 226. Air flow generator 240 causes external air to follow a path 242 in through openings 226, along the first grooves G1, and out through openings 228. (In FIG. 2D, path 242 is shown near the surface of plate 224 only for purposes of illustration. Air flow generator 240 is sized appropriately to pull external air down towards the bottom of the grooves G1 for maximum heat transfer.) Although air flow generator 240 is shown connected to second plate 230, generator 240 can alternately be connected to first plate 224 as shown by dashed lines 240A. In addition, generator 240 can be reversed to pull external air in through openings 228 and along through the first grooves G1 where the air exits through openings 226.

Heat exchanger 200 additionally includes an air flow generator 244, such as a radial fan, that is connected to first plate 224 adjacent to opening 232. Air flow generator 244 causes internal air to follow a path 246 in through opening 232, along the second grooves G2, and out through opening 234. (In FIG. 2D, path 246 is shown near the surface of plate 230 only for purposes of illustration. Air flow generator 244 is sized appropriately to pull internal air down towards the bottom of the grooves G2 for maximum heat transfer.)

Although air flow generator 244 is shown connected to first plate 244, generator 244 can alternately be connected to second plate 230 as shown by dashed lines 244A. In addition, generator 244 can be reversed to pull the internal air in through opening 234 and along through the second grooves G2, and push the internal air out through opening 232.

To fabricate heat exchanger 200, the above-described elements are fabricated and then assembled. Air flow structure 210 is formed using conventional techniques. Walls 220 and 222, however, are formed and attached to air flow structure 210 in accordance with the present invention.

In one embodiment, following the formation of air flow structure 210, as shown in FIGS. 3A–3B, an edge of air flow structure 210, such as first edge 216, is placed in a mold, such as a Teflon (PTFE) mold. The Teflon mold conforms to the edges of air flow structure 210. An elastomer, such as silicon rubber, is introduced into the mold and cured (allowed to solidify) such that a wall is formed to close each of the first and second grooves G1 and G2 along first edge 216. Once cured, the elastomer binds to air flow structure 210 requiring no additional adhesive. The mold is easily removed from air flow structure 210 because the silicon rubber will not stick to the Teflon mold.

The process is reversed and the opposite edge of air flow structure 210, such as second edge 218 is placed in the mold. The elastomer is again introduced into the mold and cured such that a wall is formed to close each of the first and second grooves G1 and G2 along second edge 218.

Following this, the walls that close off the second grooves G2 at the first edge 216 are removed. Next, the walls that close off the first grooves G1 at the second edge 218 are removed. The walls can be removed, and excess elastomer can be trimmed away, using a sharp cutting instrument, such as a knife. As a result, each groove G1 and G2 has a substantially uniform width from the first edge 216 to the second edge 218.

Once first plate 224 has been fabricated, including the formation of openings 226 and 228, and second plate 230 has been fabricated, including the formation of openings 232 and 234, air flow generators 240 and 244 are connected to second and first plates 230 and 224, respectively.

Following this, air flow structure 210, including alternately removed silicon rubber walls 220 and 222, is attached to second plate 230 using conventional adhesives. This structure is then attached to first plate 224 using conventional adhesives to form heat exchanger 200 as an air tight unit such that external air can only flow through openings 226 and 228, and internal air can only flow through openings 232 and 234.

External power cords, which provide power to air flow generators 240 and 244, can be routed out through the unit and sealed in a conventional manner. In addition, less thermal stress can be obtained if the materials used to fabricate air flow structure 210, first plate 224, and second plate 230 have similar thermal coefficients. (Although one method of assembling the elements has been described, heat exchanger 200 can alternately be formed by altering the order of assembly.)

In a second embodiment, a number of wall sections can be individually formed, such as by plastic injection molding, such that each wall section has a width that is substantially equal to a width of a groove. Once formed, the wall sections can be connected to air flow structure 210 by applying an adhesive to the walls sections, and then placing the wall sections in grooves G1 and G2 to form walls 220 and 222. Following this, heat exchanger 200 can be assembled as described above.

One of the advantages of the present invention is that air flow structure 210 can be easily manufactured to have any number of grooves per 2.54 centimeters (inch), thereby significantly improving the heat transfer efficiency. By increasing the number of grooves per 2.54 centimeters (inch), the efficiency of the heat exchanger can be increased to an optimum point. Experimental results have shown that using six grooves per 2.54 centimeters (inch) (with a fixed air velocity) increases the heat transfer efficiency of the heat exchanger by approximately 50%.

Another advantage of the present invention is that the method of forming the walls 220 and 222 in air flow structure 210 is significantly less expensive than prior art fabrication techniques which require that individual crimped ends be sealed or caulked by hand. In the first embodiment, the silicon rubber ends are easily formed and then alternately removed to form the end walls 220 and 222, while in the second embodiment the plastic end walls 220 and 222 are easily formed and adhesively connected. Thus, the heat exchanger of the present invention provides fabrication cost advantages as well.

Another advantage of the present invention is that heat exchanger 200 can be easily fabricated as part of a door or access panel of a telecommunications cabinet. This increases the ease of fabrication of the cabinet, ease of replacement of a failed heat exchanger, and ease of upgrade of existing cabinets.

Figure 5:
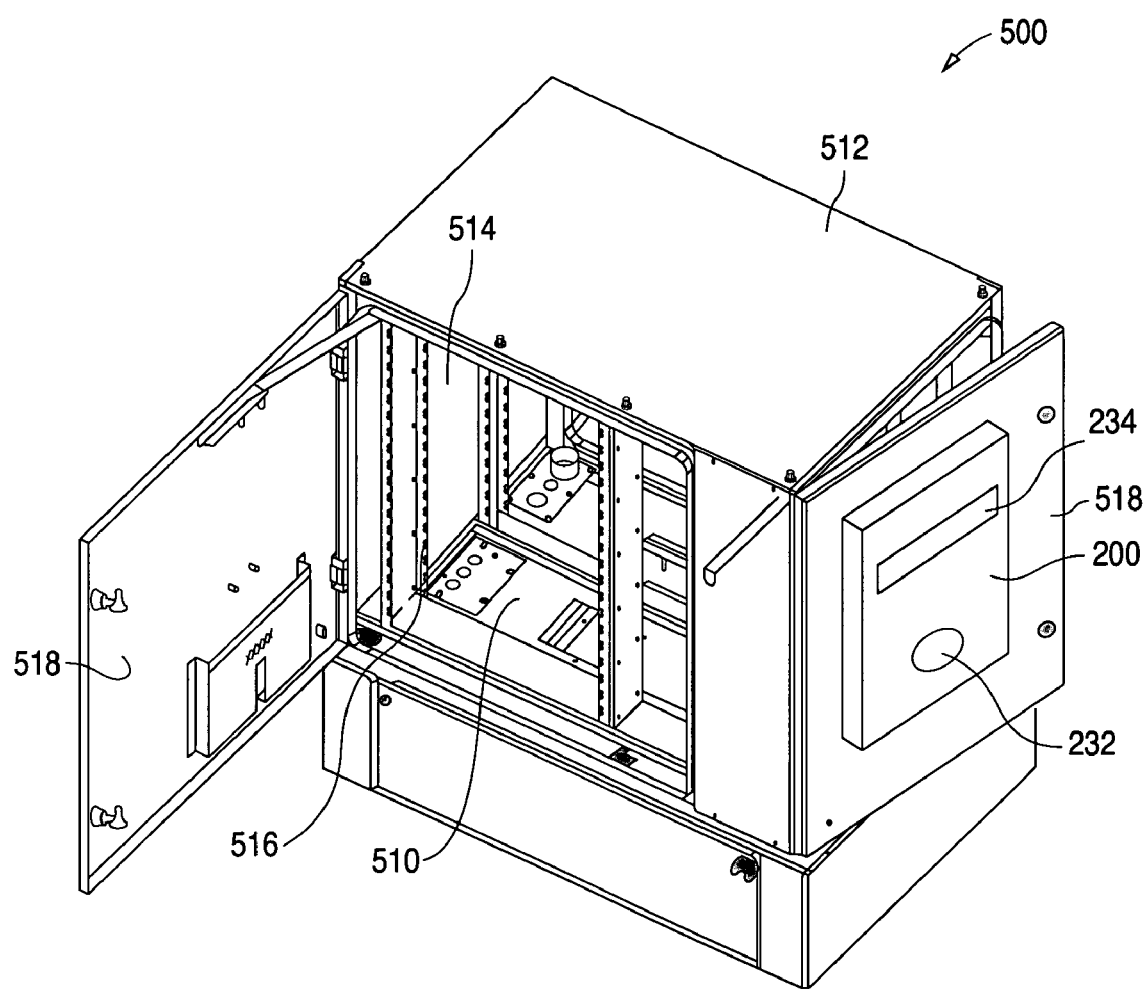
FIG. 5 is a perspective view illustrating an example of a telecommunications cabinet 500 in accordance with the present invention.

FIG. 5 shows a perspective view that illustrates an example of a telecommunications cabinet 500 in accordance with the present invention. As shown in FIG. 5, cabinet 500 includes a base plate 510, a top plate 512, and a number of side walls 514 that are connected to base plate 510 and top plate 512.

In addition, cabinet 500 includes a rack 516 that holds electronic equipment inside of cabinet 500. Further, cabinet 500 includes a number of doors 518 that are connected to the side walls 514 via hinges or other rotational means to provide access to the interior of cabinet 500. As further shown in FIG. 5, heat exchanger 200 can be fabricated as part of a door 518. When the doors 518 are closed, base plate 510, top plate 512, and side walls 514 form an air tight and water tight seal.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a heat exchanger, the method comprising:

forming an air flow structure that has a top surface, a bottom surface, a width, a length, a first edge that runs along the width, a second edge that runs along the width, a plurality of first grooves in the top surface, and a plurality of second grooves in the bottom surface, the first and second grooves extending along the length between the first and second edges, each groove having a substantially uniform width from the first edge to the second edge; and forming a plurality of first walls connected to the air flow structure by:

placing the first edge in a mold; and introducing an elastomer into the mold.

2. The method of claim 1, further comprising:

curing the elastomer such that a wall is formed to close each of the first and second grooves along the first edge; and removing the walls that close off the second grooves at the first edge.

3. The method of claim 2, further comprising forming a plurality of second walls connected to the air flow structure by:

placing the second edge in the mold; and introducing the elastomer into the mold.

4. The method of claim 3, further comprising:

curing the elastomer such that a wall is formed to close each of the first and second grooves along second edge; and removing the walls that close off the first grooves at the second edge.

5. The heat exchanger of claim 4 wherein the elastomer includes silicon rubber.

6. A method of forming an air flow structure that has a plurality of alternating ridges and grooves, each ridge and groove having sidewalls that extend from a first end to a second end, a first opening at the first end, a second opening at the second end, and an elongated opening that extends from the first opening to the second opening, the method comprising:

forming a first wall connected to the first end of the air flow structure to completely close each first opening of a plurality of ridges and grooves;

forming a second wall connected to the second end of the air flow structure to completely close each second opening of a plurality of ridges and grooves, removing the first wall that closes off each first opening of the ridges; and removing the second wall that closes off each second opening of the grooves.

7. The method of claim 6 wherein the first wall completely closes the first opening of each ridge and groove.

8. The method of claim 7 wherein the second wall completely closes each second opening of each ridge and groove.

9. The method of claim 8 wherein forming the first wall comprises:

placing the first end in a mold;
introducing an elastomer into the mold; and
curing the elastomer to form the first wall.

10. The method of claim 9 wherein forming the second wall comprises:

placing the second end in the mold;
introducing the elastomer into the mold; and
curing the elastomer to form the second wall.

11. The method of claim 10 wherein the elastomer includes silicon rubber.

12. The method of claim 6 wherein forming the first wall comprises:

placing the first end in a mold;
introducing an elastomer into the mold; and
curing the elastomer to form the first wall.

13. The method of claim 12 wherein forming the second wall comprises:

placing the second end in the mold;
introducing the elastomer into the mold; and
curing the elastomer to form the second wall.

14. The method of claim 13 wherein the elastomer includes silicon rubber.

* * * * *